United States Patent [19]

Kinney

[11] Patent Number: 5,321,258

[45] Date of Patent: Jun. 14, 1994

[54] OPTICAL WAVEGUIDE FOR AN OPTIC SENSOR

[75] Inventor: Terrance R. Kinney, South Bend, Ind.

[73] Assignee: Control Development, Inc., South Bend, Ind.

[21] Appl. No.: 67,564

[22] Filed: May 26, 1993

[51] Int. Cl.$^5$ .............................................. H01N 5/16
[52] U.S. Cl. .................... 250/227.21; 250/227.24
[58] Field of Search ............... 250/227.11, 227.24, 250/227.21, 225; 385/12, 125

[56] References Cited

U.S. PATENT DOCUMENTS

| | | | |
|---|---|---|---|
| 4,554,449 | 11/1985 | Taniuchi et al. | 250/227 |
| 4,763,398 | 8/1988 | Huizing et al. | 385/125 |
| 4,797,549 | 1/1989 | Ho et al. | 385/12 |
| 4,843,232 | 6/1989 | Emo et al. | 250/225 |
| 4,930,863 | 6/1990 | Croitorin et al. | 385/125 |
| 4,932,749 | 6/1990 | Haidle et al. | 385/125 |
| 5,005,944 | 4/1991 | Laakmann et al. | 385/125 |

*Primary Examiner*—David C. Nelms
*Attorney, Agent, or Firm*—Gary M. Hartman; Domenica N. S. Hartman

[57] ABSTRACT

An optical sensor unit is provided which is capable of being manufactured as a small sensor package as a result of a novel housing used to align a sensing element with respect to an incoming optical signal, such as a beam of light generated by an LED or laser. An arcuate internal passage within the housing defines a reflective optical waveguide which is capable of redirecting the light as it travels through the housing, such that mirrors, prisms and collimating lenses are not required. Furthermore, the optical waveguide is an improvement over the use of optical fibers which are bent to form a waveguide, in that losses and mechanical failures associated with sharp bends in optical fibers are avoided.

20 Claims, 4 Drawing Sheets

PRIOR ART
Fig. 1

PRIOR ART

OPTICAL WAVEGUIDE FOR AN OPTIC SENSOR

The present invention generally relates to optical devices used as sensors. More particularly, this invention relates to an optical waveguide which is suitable for housing an optical sensing element, wherein the optical waveguide provides an optical path having a sharp bend without the use of fiber waveguides, prisms, or mirrors, and is characterized by minimal optical losses, while also being readily suited for mass production techniques.

BACKGROUND OF THE INVENTION

Sensors which operate on the basis of optical phenomena have found uses in various fields. Examples include speed, proximity and electrical current sensors which use magneto-optic crystals, strain gauge sensors which use birefringent crystals, and temperature sensors which use fluorescent crystals. This diverse class of sensors typically has in common the use of some type of optical fiber for the purpose of transmitting a light beam from a suitable light source to an optical sensing element, and from the optical sensing element to a suitable photodetector, with which an optical signal can be detected to evaluate the particular condition being sensed. Generally, optical fibers operate on the basis of total internal reflection resulting from the different refractive indices of the fiber core and the cladding material which surrounds the fiber core.

Figure 1:
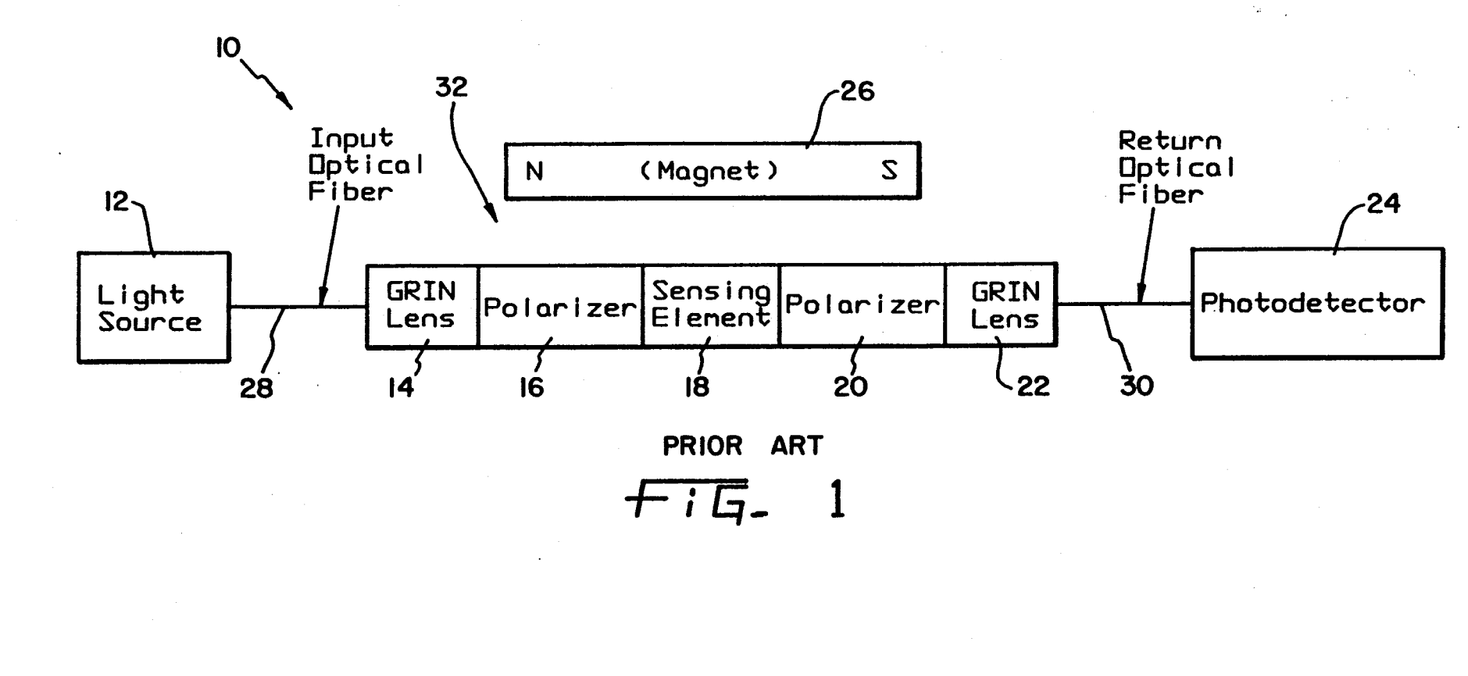
FIG. 1 is a schematic illustration of a conventional magnetic field optical sensor known in the prior art.

For many applications, an optical sensor is constructed such that the individual components are axially aligned, as schematically represented by FIG. 1. FIG. 1 illustrates a magnetic field sensor 10 which operates by sensing the modulation of a magnetic field created by a magnet 26. Such an arrangement is useful to sense rotation by mounting the magnet 26 on a rotating shaft (not shown). As the shaft rotates, the magnetic field in the vicinity of the sensor 10 increases and decreases as the magnet 26 approaches and retreats from, respectively, a Faraday material which serves as a sensing element 18 in the sensor 10.

Faraday materials are well known in the art to exhibit what is termed Faraday rotation. Faraday rotation is the change in the polarization of an electromagnetic wave as it travels through certain substances. With respect to sensing magnetic fields with optical sensors, the phenomenon is often referred to as magneto-optical rotation, which is the tendency of a magnetic field to rotate the plane of polarization of light passing through a substance. Therefore, as polarized light passes through a Faraday material, the linear polarization vector of the light will rotate in response to a nearby magnetic field. The degree of rotation is generally proportional to the strength of the magnetic field.

Conventionally, the optical sensor 10 requires a suitable light source 12, such as an LED or laser, an input optical fiber 28 to deliver the light beam to the Faraday material 18, and a return optical fiber 30 which delivers the altered optical signal to a suitable photodetector device 24. In addition, the optical sensor 10 typically includes a grated index (GRIN) lens 14 which serves to collimate the optical signal from the light source 12, and a first linear polarizer 16 which serves to confine the transverse waves of the optical signal to a specific plane prior to entering the sensing element 18. The optical sensor 10 also includes a second linear polarizer 20 and a second GRIN lens 22 for the optical signal as it leaves the Faraday material and travels toward the photodetector device 24. The second polarizer 20 generally serves as an analyzer to determine the degree of rotation of the light beam after it has passed through the sensing element 18. With respect to the first polarizer 16, the second polarizer 20 is angularly offset such that changes in the optical signal corresponding to the modulation of the magnetic field will be more readily detected by the photodetector 24.

As one would expect, the streamlined arrangement of the optical sensor 10 is not well suited for applications that have minimal space to accommodate a sensor, such as a speed sensor used in an automotive anti-lock braking system. Consequently, optical sensors 32 such as the one shown in FIG. 2 have been developed. This optical sensor 32 is constructed to receive both optical fibers 28 and 30 on one side of a sensor housing 34 so as to facilitate the use of the sensor 32 within smaller installations. Also notable with this design is the use of a single magnet 26 mounted stationary with respect to the sensor 32, wherein modulation of the magnetic field is induced by a toothed wheel (not shown) which rotates within the magnetic field.

Figure 2:
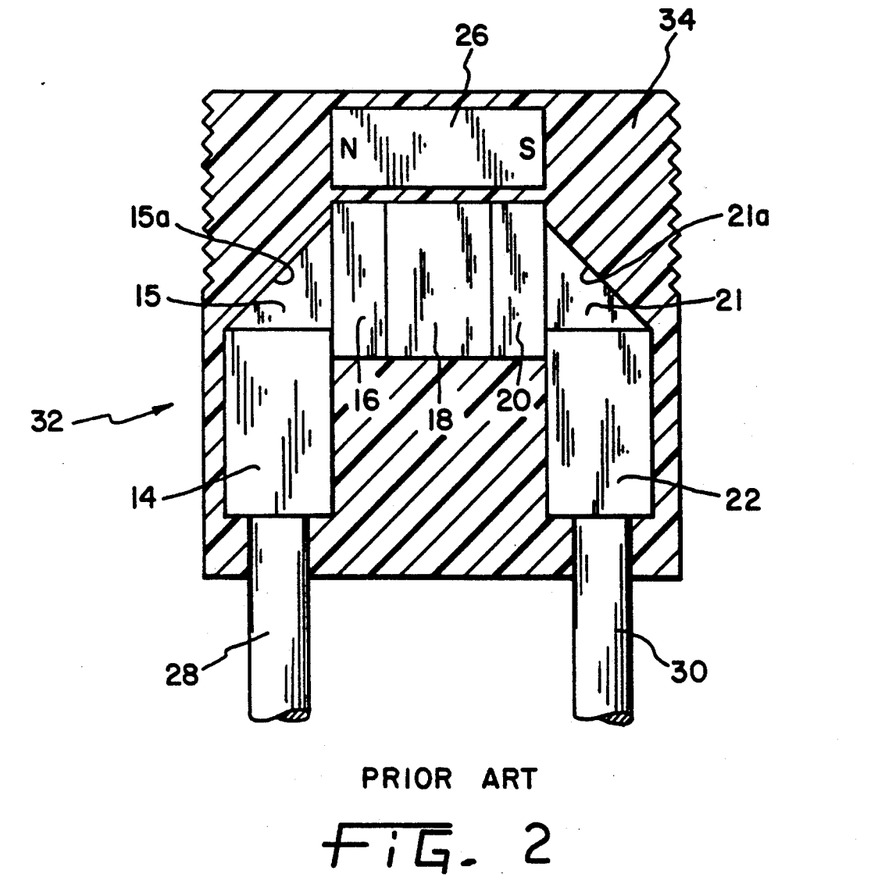
FIG. 2 shows another conventional magnetic field optical sensor known in the prior art.

Again, the sensor 32 includes a pair of GRIN lens 14 and 22, as well as a pair of linear polarizers 16 and 20. In addition, such sensors 32 are known to include prisms 15 and 21. The inclined faces 15a and 21a of the prisms 15 and 21 serve to reflect the light beam at right angles so as to enable the light beam to negotiate the 180 degree turn within the housing 34.

While the above arrangement may be suitable for some applications, the added complexity of the construction as well as the precision required to optically align the individual components of the sensor 32 are undesirable for mass production. Furthermore, high component costs are associated with the sensor 32 of FIG. 2, as well as significant levels of optical losses.

Alternatively, it is known in the art to extend the optical fibers 28 and 30 further into the housing such that the optical fibers 28 and 30 serve as optical waveguides in place of the prisms 15 and 21. To do so, the input fiber 28 must be bent sufficiently such that its fiber end is aligned with the Faraday material to redirect the light beam into the sensing element 18. Similarly, the return optical fiber 30 must be bent sufficiently such that its fiber end is aligned with the opposite side of the sensing element 18, thereby permitting the light to be received from the sensing element 18 and redirected so as to travel in a direction substantially parallel to the direction in which the light beam entered the housing.

While a benefit to this approach is the elimination of the prisms 15 and 21, a significant disadvantage is that, at a sharp bend within the optical fibers 28 and 30, much of the light is absorbed by the cladding material which surrounds the optical fiber core. This loss occurs because the light travelling through the core will be incident on the cladding material at an angle which exceeds the maximum angle for total internal reflection. As a result, the use of an optical fiber as a waveguide under these circumstances produces a sensor which is lossy (i.e., characterized by high attenuation per unit length), causing the optical signal produced by the sensing element 18 to be significantly attenuated, such that the sensitivity of the sensor is reduced. Furthermore, producing sharp bends in an optical fiber without damaging or misaligning the optical fiber necessitates skilled labor to assemble the sensor, which frustrates the ability to mass produce such a sensor.

As a further disadvantage, while large core optical fibers are desirable because they have the potential for being lower cost, reducing connector losses and costs, and are able to launch more power into the sensing element, sharp bends in large core optical fibers (e.g., cores as large as about 1 millimeter) are susceptible to breakage as stress is relieved over time. Accordingly, large core optical fibers cannot be readily used as a waveguide in applications that require a small size optical sensor.

Thus, it would be desirable to provide a low cost, high volume optical sensor which is constructed so as to enable the sensor to be suitable for applications whose size requirements are limited, while requiring a minimal number of optical components, and without requiring the use of an optical fiber as the waveguide to and from the sensing element.

SUMMARY OF THE INVENTION

It is an object of this invention to provide an optical sensing unit which includes a housing that defines an optical waveguide capable of altering the direction of travel of a light beam through the housing, so as to minimize the size of the sensing unit.

It is a further object of this invention that such an optical waveguide enables the optical sensing unit to operate with fewer internal optical components so as to enhance the manufacturability, while minimizing the cost of the sensing unit.

It is another object of this invention that such an optical waveguide obviates the use of an optical fiber waveguide for the purpose of altering the direction of light as it travels through the sensing unit.

It is still a further object of this invention that such a housing facilitates the assembly of the optical sensing unit.

It is yet another object of this invention that such an optical waveguide induces relatively low losses as the light beam travels through the optical sensing unit.

It is still another object of this invention that such an optical waveguide enables large core optical fibers to be used so as to carry the light beam to and from the housing.

In accordance with a preferred embodiment of this invention, these and other objects and advantages are accomplished as follows.

According to the present invention, there is provided a housing which provides an optical waveguide for an optical sensing element located within the housing. The housing positions the sensing element such that a light beam travelling through the housing is transmitted through the sensing element. The sensing element may be a Faraday material which operates on polarized light in response to a magnetic field by rotating the plane of polarization of the light as it passes through the sensing element. The housing is interconnected with an input optical fiber and a return optical fiber. The input optical fiber serves to deliver the light beam from a suitable light source to the sensing element, while the return optical fiber delivers the light from the sensing element to a photodetector for analysis. The housing serves to properly align the sensing element with each of the optical fibers.

The housing includes an internal passage which has an optically reflective surface so as to define an optical path for the light beam as it travels through the housing. In a preferred embodiment, the optically reflective surface has an arcuate form which enables the light to be transmitted through the housing by internal reflection, with low losses being attributable only to absorption. As the light beam travels through the housing, its direction of travel is altered as it is reflected off the optically reflective surface of the internal passage.

The use of the housing's internal passage as a waveguide instead of an optical fiber waveguide permits the light to travel an arc having a radius which is roughly that of the optical fibers transmitting the light to and from the housing. Such a capability enables the size of the housing to be significantly reduced, while also permitting the light to negotiate a full 180 degree turn within the housing. While the use of optical fiber waveguides would conventionally be preferred on the basis of low losses associated with their use, it has been determined that even lower losses can be achieved with the waveguide of this invention under circumstances where a very sharp bend is required to achieve a minimum size for an optical sensor. By defining the optical waveguide with the internal passage within the housing instead of an optical fiber, transmission of the light to and from the sensing element is accomplished by internal reflection, without concern for losses resulting from the arc path having too small a radius. Furthermore, the optical waveguide of this invention permits the use of large core optical fibers, which enable more power to be launched into the sensing element.

The optical waveguide also obviates the need for prism reflectors for the purpose of reflecting the light at right angles. Other conventional optical components, such as mirrors and GRIN lenses are also rendered unnecessary by the optical waveguide of this invention. Instead, the light beam is relayed from the input optical fiber directly to the optical sensing element by way of a first portion of the optical waveguide, with the direction of the light beam being altered by internal reflection toward the sensing element. Upon leaving the sensing element, the light is again redirected toward the return optical fiber by way of a second portion of the optical waveguide. The total effect of the optical waveguide is to enable the direction of travel of the light beam to be completely reversed—i.e., a 180 degree turn is imparted on the light beam as it proceeds through the housing.

As a result, an optical sensing unit formed from the optical waveguide of this invention requires fewer internal optical components than conventionally employed by the prior art. Accordingly, optical alignment of such internal components is also eliminated, resulting in an optical sensing unit which is more readily manufacturable because it can be more readily assembled.

Other objects and advantages of this invention will be better appreciated from the following detailed description.

BRIEF DESCRIPTION OF THE DRAWINGS

The above and other advantages of this invention will become more apparent from the following description taken in conjunction with the accompanying drawing wherein.

DETAILED DESCRIPTION OF THE INVENTION

An optical sensor unit is provided which is capable of being manufactured as a small sensor package as a result of a novel housing used to align a sensing element with respect to an incoming optical signal, such as a beam of light generated by an LED or laser. An internal passage within the housing defines a reflective optical waveguide which is capable of redirecting the light beam as it travels through the housing, such that mirrors, prisms and collimating lenses are not required. Furthermore, the optical waveguide is an improvement over the use of optical fibers which are bent to form a fiber waveguide, in that losses and mechanical failures associated with sharp bends in optical fibers are completely avoided.

Figure 3:
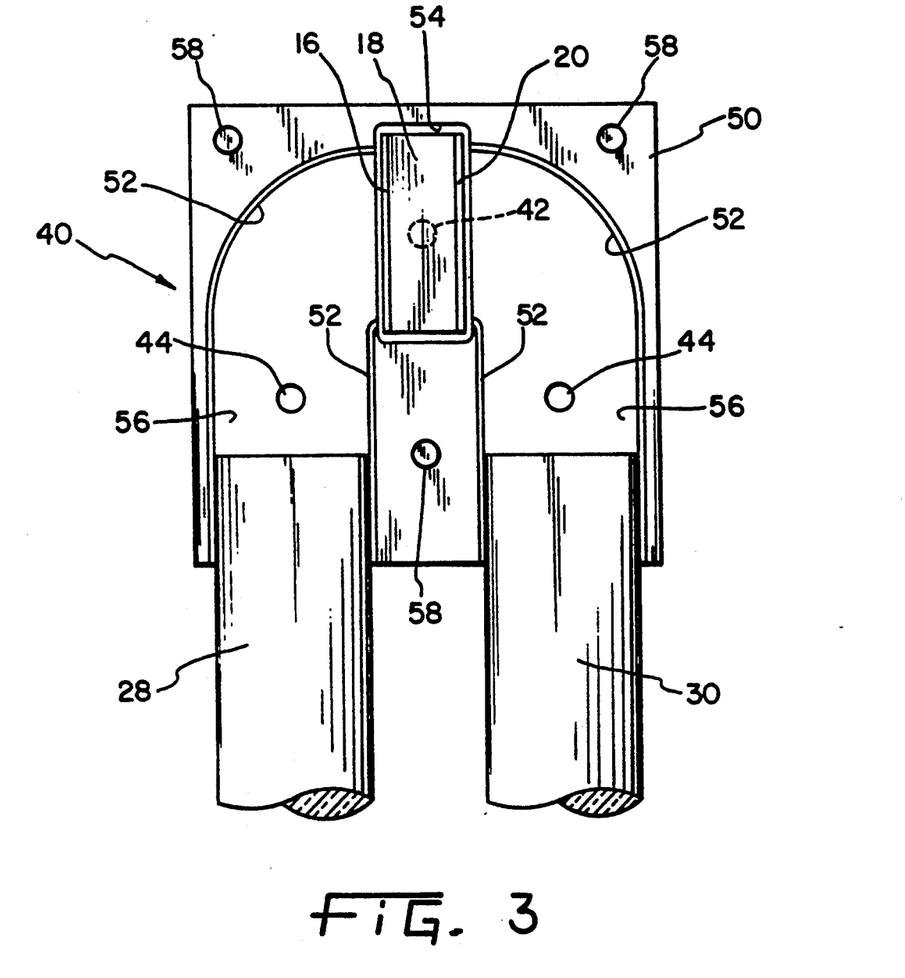
FIG. 3 shows an optical sensing unit in accordance with a first embodiment of this invention.

Referring to FIG. 3, a first embodiment of an optical sensor unit 40 in accordance with this invention includes a waveguide housing 50 which can be made from any suitably durable material, such as aluminum, polyetheretherketone (PEEK), liquid crystal polymers, polycarbonate, and nylon. Preferably, the housing 50 is composed of two nearly identical halves (only one of which is shown) which are secured together with any suitable means, such as the alignment pins 58 illustrated. The alignment pins 58 can be furnished with barbs (not shown) which engage holes formed in the second half of the housing 50 to secure the halves together and thereby form a unitary housing 50.

The housing 50 serves to optically align an input optical fiber 28 and a return optical fiber 30 with an optical sensing element 18, such as a Faraday material. A preferred Faraday material for purposes of this invention is bismuth-substituted yttrium-iron-garnet (BiYIG) having a high Verdet constant of about 0.5 degrees rotation per micrometer of thickness, though other materials will also be recognized as being suitable by those skilled in the art. In a preferred embodiment, the sensing element 18 includes a pair of polarizers 16 and 20 bonded to opposite surfaces of the sensing element 18, such that the light beam passes through the polarizers 16 and 20 as it enters and leaves the sensing element 18.

In the present example in which the sensing element 18 is a Faraday material, the optical sensor unit 40 would be used to sense speed by detecting the modulation of a magnetic field as a shaft (not shown) rotates. Such an application may employ one or more magnets mounted to a rotating shaft or sprocket, as previously described with respect to FIG. 1. Alternatively, and as previously described with respect to FIG. 2, a magnet can be mounted stationary with respect to the sensor unit 40, with its magnetic field being modulated by a toothed wheel rotating within the magnetic field.

While such an application illustrates a highly desirable use for the optical sensor unit 40 of this invention, the teachings of this invention are not limited to such a use. In particular, the principals of this invention are also applicable to strain gauge sensors based on the use of birefringent crystals, and temperature sensors based on the use of fluorescent crystals, as well as other suitable applications.

In addition to optically aligning the optical fibers 28 and 30, the housing 50 also serves as an optical conduit between the fiber ends of the optical fibers 28 and 30 and the sensing element 18. To achieve this purpose, the housing 50 is preferably formed with an arcuate internal passage 56, as seen in FIG. 3. The internal passage 56 enables a light beam entering the housing 50 to be reflected 180 degrees or more before leaving the housing 50. In addition, the internal passage 56 can be readily formed to define an arc whose radius is less than that of the optical fibers 28 and 30, which enables the size of the housing 50 to be optimized for applications requiring very small sensor units.

Alternatively, the internal passage 56 can be formed to have one or more planar reflective surfaces (not shown) which serve to reflect the light beam from the input optical fiber 28, through the sensing element 18, and back to the return optical fiber 30. For example, a single planar reflective surface could be disposed at about 45 degrees relative to both the optical path of the light beam as it enters the housing 50 via the input optical fiber 28 and the desired optical path of the light beam through the sensing element 18. Similarly, a single planar reflective surface could be disposed at about 45 degrees relative to both the optical path of the light beam as it passes through the sensing element 18 and the desired optical path of the light beam as it exits the housing 50 via the return optical fiber 30. However, further discussion of the internal passage 56 will be directed to the arcuate embodiment depicted in FIG. 3 for the sake of brevity.

Furthermore, it is worth noting that the placement of the sensing element 18 within the internal passage 56 is not limited to the apex of the curvature of the internal passage 56, as is shown in FIG. 3. For example, the sensing element 18 could also be located to either side of the apex of the internal passage 56, as well as within one of the linear portions of the internal passage 56 closer to the optical fibers 28 and 30. In fact, physical as well as operational aspects of a particular application may necessitate the placement of the sensing element 18 within the internal passage 56 at a position other than that shown in FIG. 3. Accordingly, the teachings of this invention are not to be interpreted as limited to the specific configuration illustrated in the Figures.

In order to operate as an optical waveguide, an optically reflective coating 52 is deposited on the surface of the arcuate internal passage 56. The reflective coating 52 is preferably formed by metallizing the entire interior surface of the internal passage 56 using any suitable method, such as by depositing aluminum, silver, gold or chromium using an evaporation deposition process, a sputtering deposition process, or a chemical etch and electroplating process. A preferred thickness for the reflective coating 52 is about 5000 angstroms, though it is foreseeable that significantly greater or lesser thicknesses could be used without adversely affecting the optical properties of the reflective coating 52. While only metallization of the internal passage 56 is required, other surfaces of the housing 50 may also be metallized to facilitate the manufacturing process.

Only a small fraction of the light is lost due to absorption by the reflective surface 52, with much of the light being continuously reflected within the internal passage 56 as it travels from the input optical fiber 28 to the return optical fiber 30. Accordingly, low losses are attributable to the optical waveguide generated in accordance with this invention. Surprisingly, these losses can be lower than those associated with optical fiber waveguides known in the prior art where a very sharp bend is required to minimize the size of an optical sensor.

The sensing element 18 is positioned within a cavity 54 formed preferably at the apex of the arc defined by the internal passage 56. The sensing element 18 is placed within the cavity 54 prior to mating the halves of the housing 50. Once the housing 50 is assembled, the ends of the optical fibers 28 and 30 can be inserted into the corresponding openings formed in the housing 50 by the extremities of the internal passage 56.

To further secure the sensing element 18 within the housing 50, it may be desirable to inject a suitable optical cement (not shown) into the housing 50 to fill the void between the ends of the optical fibers 28 and 30 and the sensing element 18. For this purpose, a pair of filling ports 44 and an exit port 42 can be provided, as shown in FIG. 3. Suitable optical cements are well known in the art, and include epoxies, UV-curable adhesives, as well as other thermosets and thermoplastics. Such optical cements preferably provide an index match between the sensing element 18 and the ends of the optical fibers 28 and 30, and permit the use of a rough ground sensing element 18. An additional benefit to using an optical cement is that the cement prevents foreign matter from entering the internal passage 56 during later processing and handling.

Figure 5:
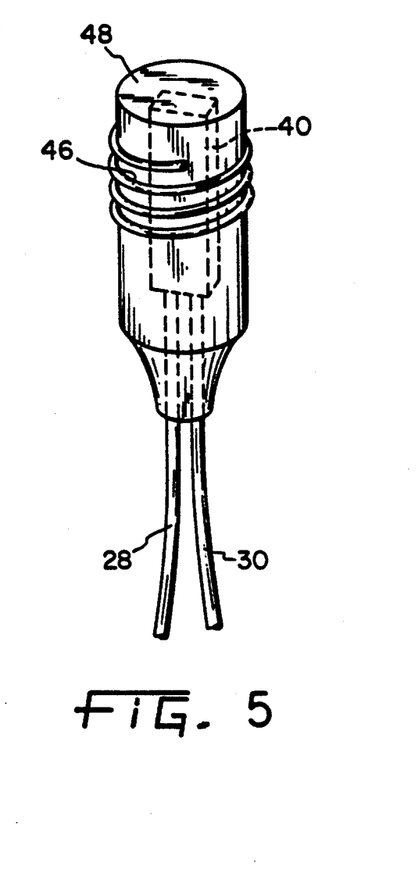
FIG. 5 shows an optical sensing unit in accordance with either one of the embodiments of this invention, wherein the optical sensing unit is overmolded within a suitable sensor body.

For use in most working environments, the optical sensor unit 40 of FIG. 3 is preferably enclosed within an overmolded body 48, as shown in FIG. 5, to protect the sensor unit 40 from moisture, heat and chemical attack. The overmolded body 48 can be formed from a suitable structural thermoplastic or thermoset, such as acrylonitrile-butadiene-styrene (ABS), polyvinyl chloride (PVC), polyamide-imide (Torlon), polyetheretherketone (PEEK) or nylon. The geometry of the overmolded body 48 can be readily adapted such that the resulting modular sensor unit is properly sized for a particular installation. Features such as a flange 46 can also be incorporated into the overmolded body 48 during the molding process to facilitate installation of the modular sensor unit.

In operation, a suitable light source is used to focus a light beam into the input optical fiber 28, through which the light beam is directed into the internal passage 56 of the housing 50. In practice, an LED generating about 1 milliwatt of power has been found to be sufficient for purposes of this invention, though it is foreseeable that higher or lower power levels may be desirable based on the particular application. Once inside the internal passage 56, the light beam continues until it encounters the reflective coating 52 along a first arcuate portion of the internal passage 56, after which substantially all of the light will be further reflected toward the sensing element 18 until the angle at which the light beam is incident on the sensing element 18 is substantially normal to the facing surface of the first polarizer 16.

In the present example where the sensing element 18 is a Faraday material, as the now-polarized beam of light passes through the sensing element 18, the polarization vector of the light will be rotated in response to the imposed magnetic field. As is well known in the art, the degree by which the plane of polarization is rotated will be proportional to the strength of the magnetic field as well as the length of the sensing element 18 along the optical path of the light beam.

From the sensing element 18, the light beam enters the second polarizer 20. When properly tuned, the second polarizer 20 serves to provide a maximum change in light intensity as the magnetic field is modulated. After leaving the second polarizer 20, the light beam encounters the second arcuate portion of the internal passage 56, such that the light beam is reflected toward the return optical fiber 30, which carries the light beam to a suitable photodetector.

Figure 4:
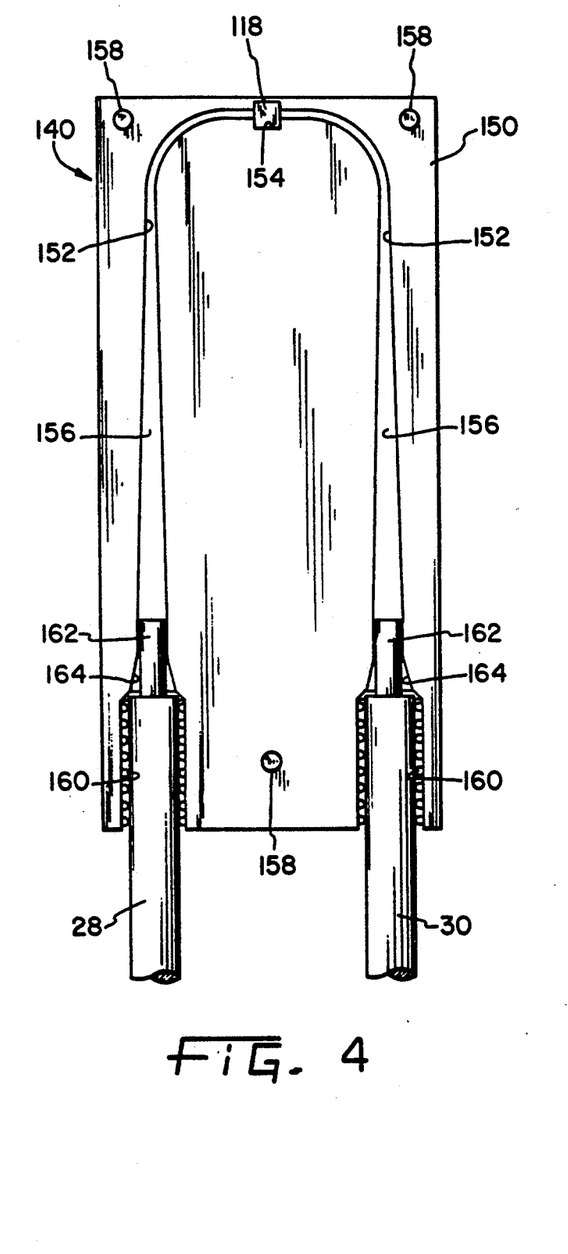
FIG. 4 shows an optical sensing unit in accordance with a second embodiment of this invention.

An optical sensor unit 140 in accordance with a second embodiment of this invention is shown in FIG. 4. As before, the sensor unit 140 includes a housing 150 having an internal passage 156 onto which a reflective coating 152 has been deposited. The primary difference between the sensor unit 140 of FIG. 4 and the sensor unit 40 of FIG. 3 is that the former incorporates an internal passage 156 which is tapered. Specifically, the internal passage 156 is tapered such that the diameter of the internal passage 156 adjacent the sensing element 118 is less than the diameter of the internal passage 156 adjacent both the input and return optical fiber members 28 and 30. As a result, larger optical fibers 28 and 30 and/or a smaller sensing element 118 can be employed. As one example, the diameter of the internal passage 156 may be about 0.25 millimeters in diameter adjacent the sensing element 118, while being about 1.0 millimeters in diameter adjacent the optical fibers 28 and 30.

The benefits of this embodiment include (1) significantly reduced material costs as a result of using a smaller sensing element 118; (2) less expensive large-core optical fibers 28 and 30 can be used so as to reduce connector losses and costs, as well as enabling more power to be launched into the sensing element 118; and (3) the bend radius of the internal passage 156 can be effectively decreased with respect to the diameter of the internal passage 156, such that optical losses induced by the bend are further reduced.

The embodiment of FIG. 4 also illustrates a preferred manner in which the optical fibers 28 and 30 are secured to the housing 150 by a number of ribs 160 formed at the entrance and exit of the internal passage 156. As the optical fibers 28 and 30 are inserted into the housing 150, the ribs 160 serve to securely grip the fiber buffer surrounding the optical fiber conduit 162. As also shown in FIG. 4, insertion of the optical fibers 28 and 30 can be facilitated by providing a chamfer 164 at each opening formed by the internal passage 56.

From the above, it can be seen that the sensor units 40 and 140 of this invention provide several significant advantages over the known prior art. First, it has been determined that the optical waveguides formed by the housings 50 and 150 of this invention make unnecessary the use of additional optical components, such as mirrors, prisms and collimating (e.g., GRIN) lenses. The reflective arcuate contours of the internal passages 56 and 156 are able to sufficiently reflect a light beam toward their corresponding sensing element 18 and 118 without the need for mirrors and prisms. Furthermore, collimating lenses are believed to be unnecessary because of the close proximity of the internal passages 56 and 156 to their respective sensor elements 18 and 118, the geometry of the sensing elements 18 and 118, and the amount of optical losses allowed. As a result, the optical sensor units 40 and 140 constructed in accordance with this invention require fewer internal optical components than previously taught by the prior art. Simultaneously, optical alignment of such internal components is also eliminated, making the optical sensor units 40 and 140 more readily assembled, and thus more readily manufacturable.

In addition, because the internal passages 56 and 156 serve as optical waveguides, there is no requirement to impose a sharp bend in either of the optical fibers 28 and 30 in order to reduce the size of the optical sensor units 40 and 140. Accordingly, the bend radii of the waveguides formed by the internal passages 56 and 156 are not limited by the mechanical and optical limitations of the optical fibers 28 and 30, permitting the use of a bend radius which is less than the radius of the optical fibers 28 and 30. Furthermore, the optical waveguides formed with the internal passages 56 and 156 of this invention permit the use of large core optical fibers, which enable more power to be launched into the sensing element 18 or 118.

It should also be noted that although the advantages associated with the optical waveguide of this invention are described in terms of a magnetic field sensor, the teachings of this invention are also applicable to other optical devices which depend on channeling a light beam into and out of a housing along nearly parallel optical paths.

Therefore, while our invention has been described in terms of a preferred embodiment, it is apparent that other forms could be adopted by one skilled in the art; for example, by modifying the geometry of the individual components or their method of assembly; by substituting appropriate materials for the housing, reflective coating or sensing element; or by utilizing the waveguide of this invention in an alternative environment. Accordingly, the scope of our invention is to be limited only by the following claims.

The embodiments of the invention in which an exclusive property or privilege is claimed are defined as follows:

1. An optical waveguide for housing an optical sensing element which operates on an optical signal that is transmitted from an input optical member through the optical waveguide to a return optical member, the optical waveguide comprising:
    a housing;
    an internal passage formed by the housing;
    an optically reflective layer deposited on a surface of the internal passage so as to define an optical path for the optical signal through the housing, the optically reflective layer altering the direction of travel of the optical signal through the housing by internal reflection;
    means for retaining the optical sensing element within the housing so as to receive the optical signal transmitted along the optical path;
    means in communication with the internal passage for coupling with the input optical member, the input coupling means being disposed with respect to the optical path so as to relay the optical signal from the input optical member to the optical path; and
    means in communication with the internal passage for coupling with the return optical member, the return coupling means being disposed with respect to the optical path so as to relay the optical signal from the optical path to the return optical member.

2. An optical waveguide as recited in claim 1 wherein the direction of travel of the optical signal leaving the housing differs from the direction of travel of the optical signal entering the housing.

3. An optical waveguide as recited in claim 1 wherein the housing is formed from a polymeric material.

4. An optical waveguide as recited in claim 1 wherein the optically reflective layer comprises a metal selected from the group consisting of aluminum, silver, gold and chromium.

5. An optical waveguide as recited in claim 1 wherein the internal passage is arcuate such that a radius of an arc defined by the internal passage through the housing is less than the radius of any one of the input and return optical members.

6. An optical waveguide as recited in claim 1 wherein the internal passage is tapered such that a diameter of the internal passage adjacent the optical sensing element is less than a diameter of the internal passage adjacent both the input and return optical members.

7. An optical waveguide as recited in claim 1 wherein the housing comprises at least two housing members which are secured together.

8. An optical waveguide as recited in claim 1 further comprising an optical cement disposed within the internal passage.

9. An optical sensing device for operating on an optical signal which is transmitted from a light source to a photodetector device, the optical waveguide comprising:
    a housing having an entrance passage and an exit passage formed therein, the entrance and exit passages being axially non-aligned with each other;
    an optical sensing element disposed within the housing;
    an input optical fiber member coupled with the entrance passage;
    a return optical fiber member coupled with the exit passage;
    an arcuate internal passage formed by the housing;
    an optically reflective layer deposited on a surface of the internal passage so as to define an arcuate optical path for the optical signal through the housing, the internal passage having a first arcuate position such that the optically reflective layer reflects the optical signal from the input optical fiber member to the optical sensing element, the internal passage having a second arcuate portion such that the optically reflective layer reflects the optical signal from the optical sensing element to the return optical fiber member, such that the optically reflective layer alters the direction of travel of the optical signal by internal reflection as the optical signal is transmitted through the housing.

10. An optical sensing device as recited in claim 9 wherein the internal passage includes an approximately 180 degree arc such that the direction of travel of the optical signal leaving the housing is approximately 180 degrees apart from the direction of travel of the optical signal entering the housing.

11. An optical sensing device as recited in claim 9 wherein the internal passage is tapered such that a diameter of the internal passage adjacent the optical sensing element is less than a diameter of the internal passage adjacent both the input and return optical fiber members.

12. An optical sensing device as recited in claim 9 further comprising an optical cement disposed within the internal passage.

13. An optical sensing device as recited in claim 9 further comprising an overmolded structure in which the housing is enclosed.

14. An optical sensing device as recited in claim 9 wherein the optically reflective layer comprises a metal selected from the group consisting of aluminum, silver, gold and chromium.

15. An optical sensing device as recited in claim 9 wherein a radius of an arc defined by the internal passage through the housing is less than the radius of any one of the input and return optical fiber members.

16. A method for transmitting an optical signal through an optical sensing element, the method comprising the steps of:

defining an arcuate optical waveguide with an optically reflective material deposited on the interior surfaces of an arcuate internal passage, the optical sensing element being optically aligned with the arcuate internal passage so as to receive the optical signal as the optical signal travels through the arcuate optical waveguide;

relaying the optical signal from an input optical member to the optical sensing element by way of a first arcuate portion of the arcuate optical waveguide, the first arcuate portion altering the direction of travel of the optical signal by internal reflection; and relaying the optical signal from the optical sensing element to a return optical member by way of a second arcuate portion of the arcuate optical waveguide, the second arcuate portion altering the direction of travel of the optical signal by internal reflection;

whereby the arcuate form of the first and second arcuate portions enables the optical signal to be transmitted through the arcuate internal passage by internal reflection of the optical signal such that the direction of travel of the optical signal entering the arcuate optical waveguide differs from the direction of travel of the optical signal exiting the arcuate optical waveguide.

17. The method of claim 16 further comprising the steps of:

defining the arcuate internal passage within a housing; and optically aligning the input and return optical members with respect to each other and with respect to the optical sensing element with the housing.

18. The method of claim 16 wherein the optically reflective material is deposited by metallizing the arcuate internal passage.

19. The method of claim 16 further comprising the step of providing an index match between the optical sensing element and the ends of the input and return optical members.

20. The method of claim 16 further comprising the steps of:

relaying the optical signal from a light source to the arcuate optical waveguide through the input optical member; and relaying the optical signal from the arcuate optical waveguide to a photodetector device through the return optical member.

* * * * *